(12) United States Patent
Durham et al.

(10) Patent No.: US 6,522,170 B1
(45) Date of Patent: Feb. 18, 2003

(54) SELF-TIMED CMOS STATIC LOGIC CIRCUIT

(75) Inventors: Christopher McCall Durham, Austin, TX (US); Peter Juergen Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 505 days.

(21) Appl. No.: 09/067,153

(22) Filed: Apr. 27, 1998

(51) Int. Cl.[7] ............................................... H03K 19/00
(52) U.S. Cl. ........................................... 326/93; 326/96
(58) Field of Search ............................... 326/93–98, 21

(56) References Cited

U.S. PATENT DOCUMENTS

| | | | |
|---|---|---|---|
| 5,373,204 A | * 12/1994 | Muramatsu et al. | 326/93 |
| 5,565,798 A | * 10/1996 | Durham et al. | 326/93 |
| 5,698,996 A | * 12/1997 | Ko | 326/93 |
| 5,708,374 A | 1/1998 | Durham et al. | 326/93 |
| 5,912,900 A | * 6/1999 | Durham et al. | 714/724 |
| 5,939,898 A | * 8/1999 | Henkels et al. | 326/93 |

* cited by examiner

*Primary Examiner*—Michael Tokar
*Assistant Examiner*—James H Cho
(74) *Attorney, Agent, or Firm*—Kelly K. Kordzik; Winstead Sechrest & Minick P.C.; Robert M. Carwell

(57) ABSTRACT

A Self-Timed CMOS Static Circuit Technique has been invented that provides full handshaking to the source circuits; prevention of input data loss by virtue off interlocking both internal and incoming signals; full handshaking between the circuit and sink self-timed circuitry; prevention of lost access operation information by virtue of an internal lock-out for the output data information; and plug-in compatibility for some classes of dynamic self-timed systems. The net result of the overall system is that static CMOS circuits can now be used to generate a self-timed system. This is in contrast to existing self-timed systems that rely on dynamic circuits. Thus, the qualities of the static circuitry can be preserved and utilized to their fullest advantage.

11 Claims, 13 Drawing Sheets

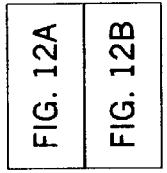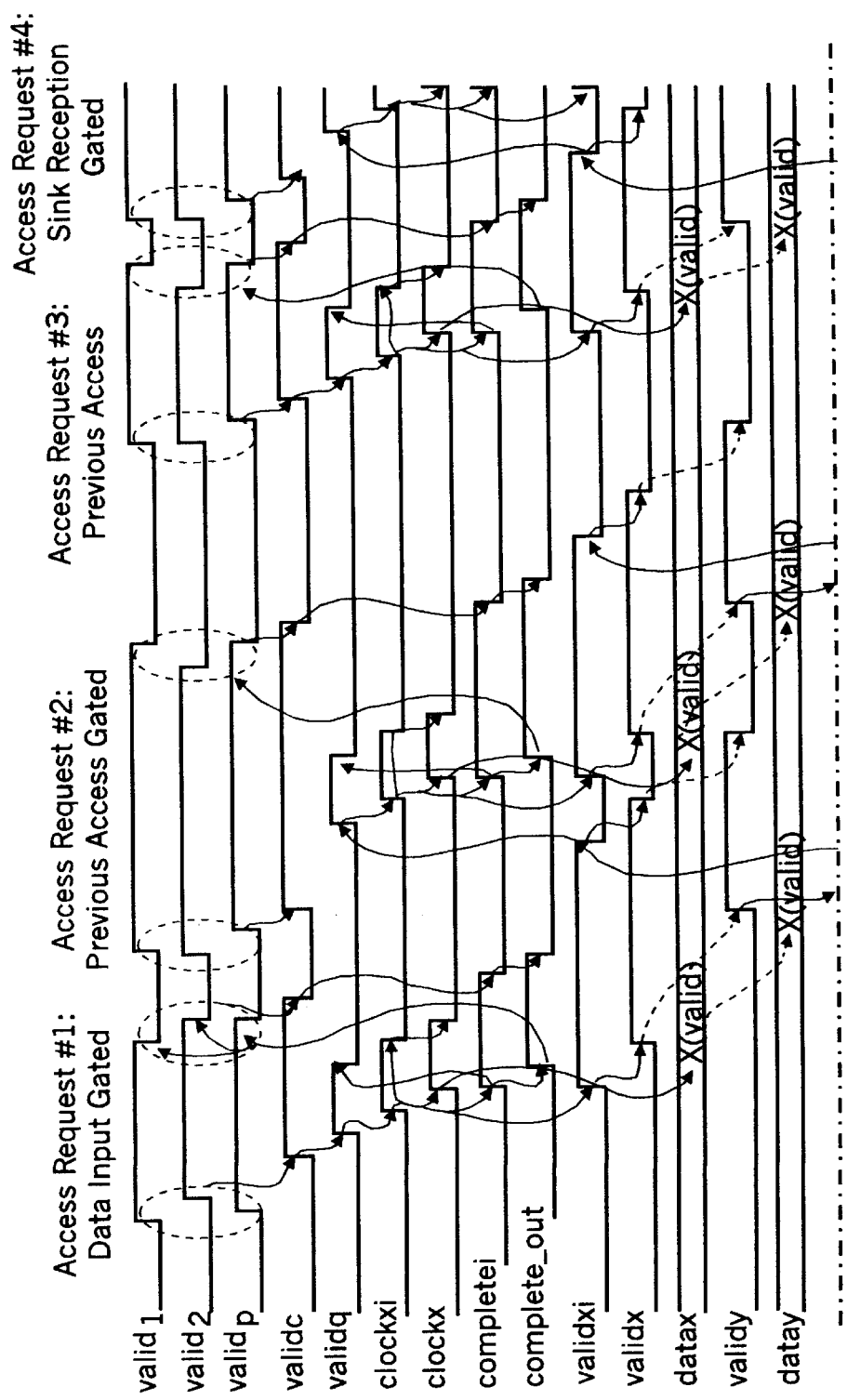

SELF-TIMED CMOS STATIC LOGIC CIRCUIT

TECHNICAL FIELD

The present invention relates in general to logic circuitry, and in particular, to self-timed logic circuitry.

BACKGROUND INFORMATION

Self-timed circuit techniques, once thought only as research-oriented projects, are quickly becoming mainstream in VLSI circuit applications. Requiring no clocks for operation, as does a traditional system, self-timed circuits operate asynchronously on the simple concept of demand. That is, a self-timed circuit operates only when asked to, generates the necessary outputs according to its own internal scheduling, and presents the results to the requester. Afterwards, the circuit "goes to sleep" and awaits the next instruction/request. While asleep, no power is dissipated since no operation is taking place.

This is contrary to traditional synchronous systems where even when a circuit is not needed, there is at least power dissipated by the clock circuitry running through the system. This idle power can be significant—studies show that clocking power is approximately 30% of the overall power on a given VLSI circuit/chip. Consequently, self-timed circuits have at least a power advantage over traditional methods.

Self-timed circuits also have significant advantages over other techniques such as self-resetting. This approach requires no interaction between driving and receiving circuitry, creating scheduling and arrival time conflicts and complications. FIG. 1 shows an example of a self-timed logic circuit pipeline, or unit 100. Note in FIG. 1 that each block 101–104 labelled "Self-timed Logic Circuit" can, itself, be a combination of self-timed circuits.

The operation of such a self-timed system is straightforward and is presented briefly below. Note that this example is an extremely small system. Also, note that each sub-block 101–104 labelled in FIG. 1 as a "Self-Timed Logic Circuit" may, itself, contain multiple self-timed circuit stages and, thus, may also contain operation internally as described below:

The input source(s) indicates to the Self-Timed Logical Unit 100 by asserting the "request" signal and enabling the "data inputs" (a bus or multiple of bus signals). Note that the number of such sources is not limited to one, but is only shown as one in FIG. 1 for simplicity.

The first (receiving) Self-Timed Logic Circuit "a" 101 notes that a "request" has been made and returns the "acknowledge" signal to the source(s). This signifies to the sources that the information on the "data inputs" has been received. The logic (not shown) that drives the source signals ("data inputs") is now free to de-assert the "data inputs", do other operations, etc., since the Self-Timed Logical Circuit "a" 101 has received the input information and has begun operating.

Self-Timed Logic Circuit "a" 101 operates on the "data inputs" and produces a "valid output signal" to Self-Timed Logic Circuits "b" 102 and "c" 103 along with "data output signals". Circuits "b" 102 and "c" 103 receive the information and send "complete out" signals back to circuit "a" 101 to signify capture of the incoming information. Circuit "a" 101 is now free to de-assert the output information and, if necessary, receive further inputs from the logical unit input sources.

Self-Timed Logic Circuits "b" 102 and "c" 103 operate on the input information and produce "valid output signals" and "data output signals", which are then sent to Self-Timed Logic Circuit "d" 104.

Circuit "d" 104 awaits for both "valid signals" to arrive, then returns a "complete out" signal back to both circuits "b" 102 and "c" 103. Circuits "b" 102 and "c" 103 are now able to de-assert their respective outputs and receive further information as necessary from circuit "a" 101.

Self-Timed Logic Circuit "d" 104 operates on the information and produces a "valid output signal" and "data output signals" to the external sink (not shown) in the overall chip system. Note that sinks (not shown) may be single or multiple, depending on the particular architecture and placement of a self-timed logical unit. When, the receiving units (sinks) signify that the information has been received (via "completion signals from sinks") the Self-Timed Logic Circuit "d" 104 may de-assert its outputs and receive further information from circuits "b" 102 and "c" 103.

To control this operation, please refer to U.S. Pat. Nos. 5,565,798 and 5,708,374, which are hereby incorporated by reference herein.

As a result of this operation, it can be seen that in the general self-timed case, no registers are required. That is, in a completely self-timed system, the combination of valid/complete cycles removes the necessity of synchronization of internal units and sub-blocks as the units, in reality, time and clock themselves. Thus, self-timed circuits and systems synchronize themselves. Therefore, in the limit, a completely self-timed microprocessor, for example, would require no on-chip or off-chip clocks.

However, most self-timed circuitry is dynamic. As such, it is prone to errors created by noise events, as are all dynamic circuits, and, additionally, must distribute the self-timing clocks to every circuit. For example, consider the circuits of FIGS. 2A, 2B, and 2C, which were described in U.S. Pat. Nos. 5,565,798 and 5,708,374. (Some signals are not shown in FIG. 2A to reduce complexity and increase understanding of the present invention.) In this circuitry, each "Domino Logic Row" of the "Self-Timed Macro Dataflow" in FIG. 2C receives a clock signal ("Strobe" or "Reset") from the control circuit in FIG. 2B. Note that each "Domino Logic Row" is constructed of a collection of domino circuits.

One drawback of such a system is in the use of the dynamic circuits for all functions. That is, dynamic circuits are susceptible to noise events, which cause them to evaluate improperly and from which they cannot recover; they require a clock signal to be routed to each circuit, which increases the design complexity and the chip clocking loading; they create more on-chip noise due to precharge/evaluate events, fast edge rates, and the multitude of clock signals (noise coupling to adjacent lines); they cause test problems, particularly at elevated temperatures and voltages, much of which is necessary for reliability and screening; and they must wait upon the clock signal in order to start the evaluation process, which makes them susceptible to clock skew problems.

Static circuits, on the other hand, do not suffer from many of these issues: they can always recover from an incorrect evaluation, given enough time, and, consequently and importantly, a correct state can always be gained by waiting; they require no clock signals, which reduces the design complexity and global chip clock loading; they tend to reduce the overall chip noise as the precharge/evaluate nature is removed and the clock signals are not required;

they are "friendly" to test at elevated temperatures and voltages as functionality is nearly always guaranteed; and they do not need to wait upon a clock signal for evaluation as one is not required. Also, they typically dissipate less power than their dynamic counterparts, mainly due to the removal of the clock signal to each circuit, which requires a switching clock signal every cycle regardless of the switching activity of the dynamic circuit. Examples of static circuits are illustrated in FIGS. 11A and 11B.

An important key, however, is performance. Dynamic circuits, with all their hazards and complications, consistently outperform static circuits in terms of delay. This means that critical circuit paths tend to be dynamic to produce the fastest chip possible, while non-critical circuit paths tend to be static to reduce power and design hazard as the performance is not critical (the chip (clock) speed is always set speed by the slowest possible path). In typical clock systems, this is not an issue as the latch boundaries separate the circuit styles, permitting static and dynamic circuits to coexist. This means, generally, that static and dynamic circuits can, effectively, be swapped in for one another without concern (the swapping can, obviously, change the delay and, thus, the critical path of the overall chip).

However, in a self-timed system, the use of static circuits is not as simple. For instance, consider the circuitry of FIG. 2C replaced with static circuitry (i.e., each "Domino Logic Row" is replaced with a "Static Logic Row"). When the inputs (1 through p) arrive, the circuitry of the first row begins to evaluate, regardless of the valid input signals. Similarly, the subsequent rows of the logic evaluate, ultimately producing the "Data Output" signals without regard to the valid and complete signals. The net result is that the interlocking concept created by the use of the dynamic circuits is lost when those circuits are replaced with static circuits. Consequently, the use of static circuits in such a system is nearly precluded.

SUMMARY OF THE INVENTION

The present invention addresses the foregoing limitations by providing a new self-timed circuitry system wherein static circuits can be used in a CMOS self-timed system. As a result, the benefits of static logic can be attained.

In one embodiment, the present invention is a self-timed logic circuit having a first transparent latch register for receiving one or more input data signals from one or more sources. The self-timed logic circuit also includes a control circuit operable for receiving one or more valid signals corresponding to each of the input data signals. A combinatorial static logic block then receives the one or more input data signals from the transparent latch register and performs one or more functions on the input data signals as a result of the static logic circuits within the logic block. A second transparent latch register then receives the output from the combinatorial static logic block. The control circuit will output the output data signals through the second transparent latch register to one or more sink circuits.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIGS. 12A and 12B illustrate a timing diagram of the operation of the circuit illustrated in FIG. 3.

DETAILED DESCRIPTION

Figure 1:
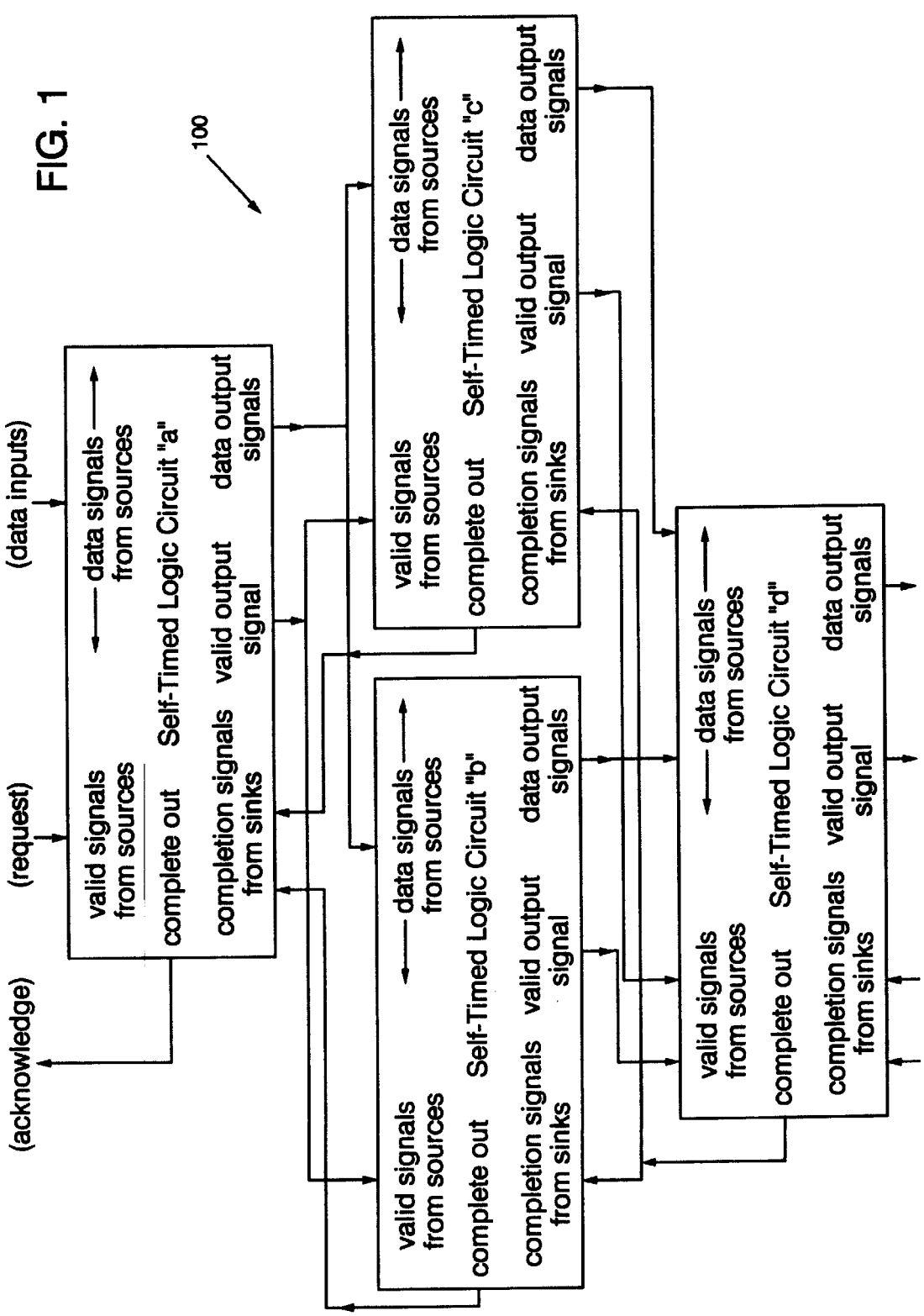
FIG. 1 illustrates a self-timed logic circuit in accordance with the present invention.
Figure 2A:
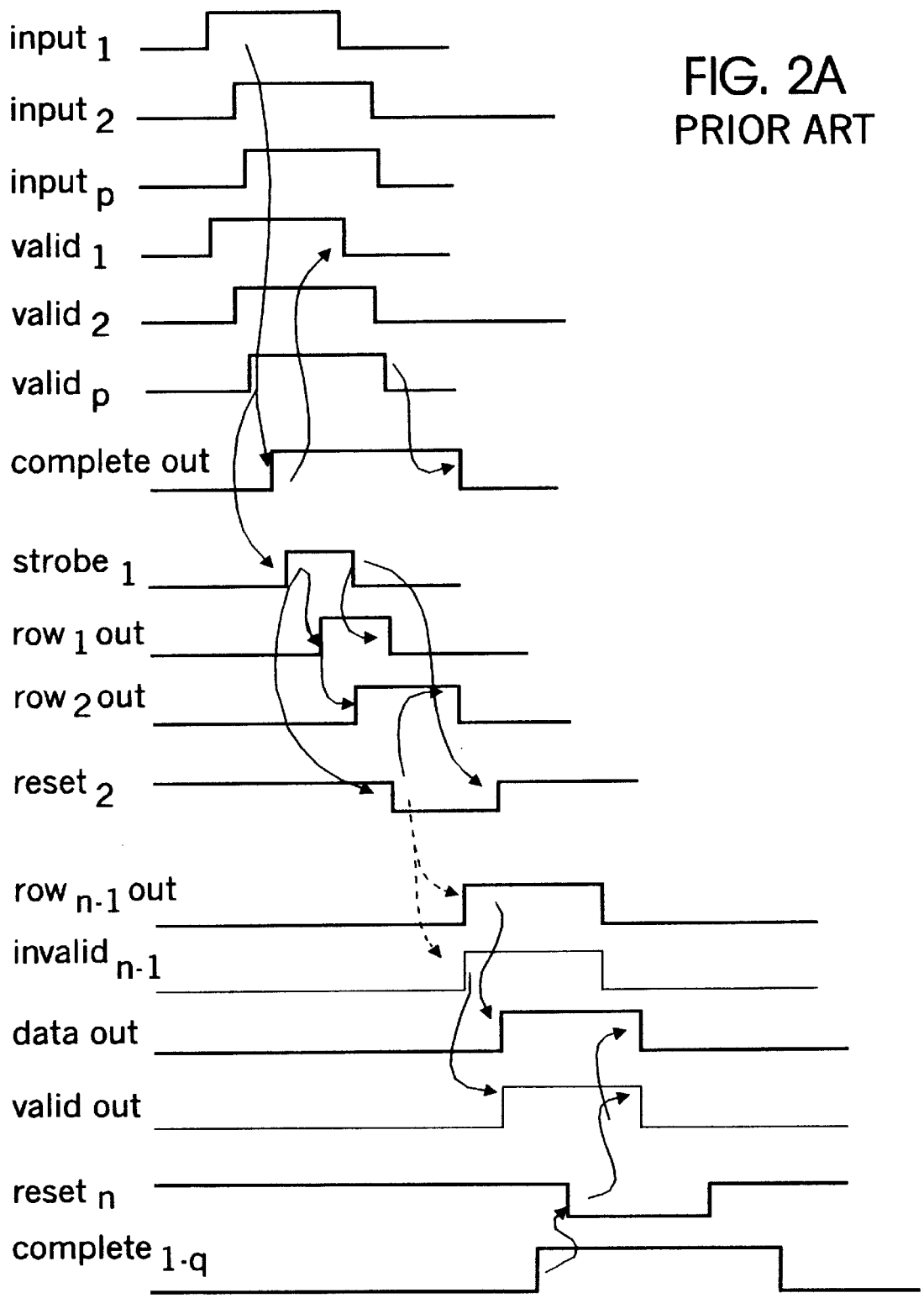
FIGS. 2A, 2B, and 2C illustrate a prior art self-timed control circuit and its operation.
Figure 2B:
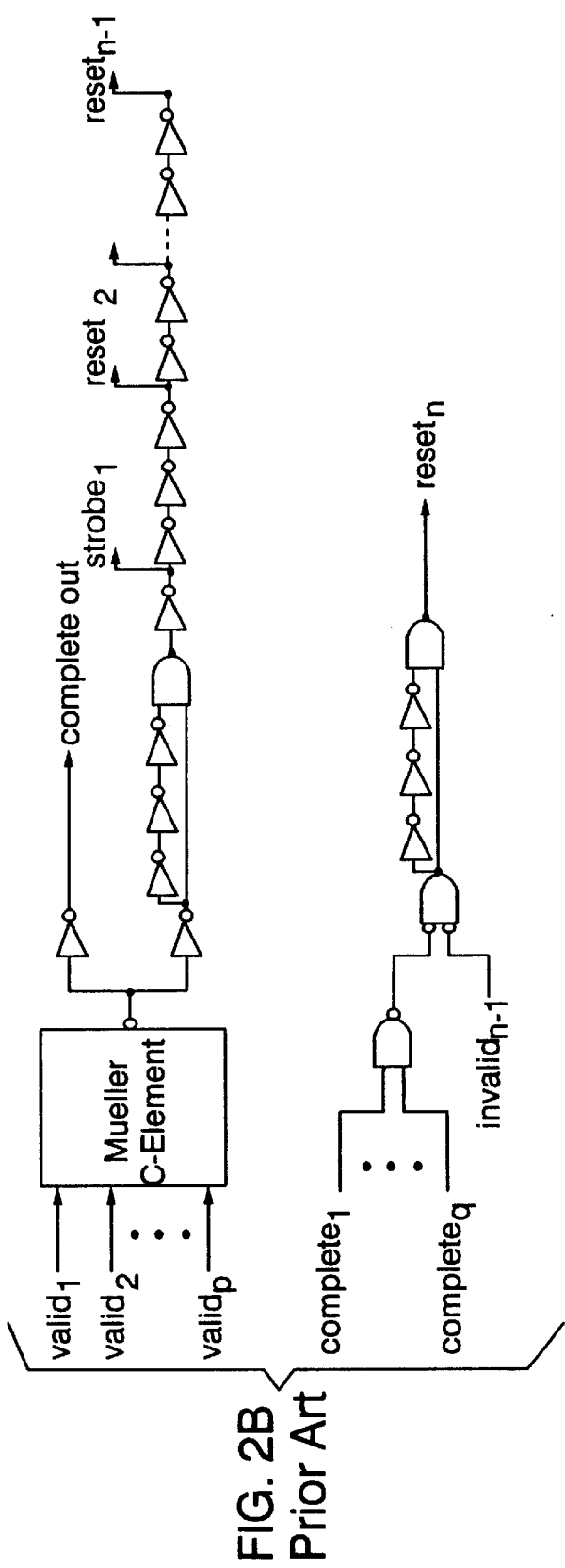

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Refer now to the drawings wherein depicted elements are not necessarily shown to scale and wherein like or similar elements are designated by the same reference numeral through the several views.

In order to fully explain the operation of the entire circuitry, it is necessary to understand the workings of each of the building blocks of FIGS. 5 through 11, as well as how they are used in the overall system.

Figure 5:
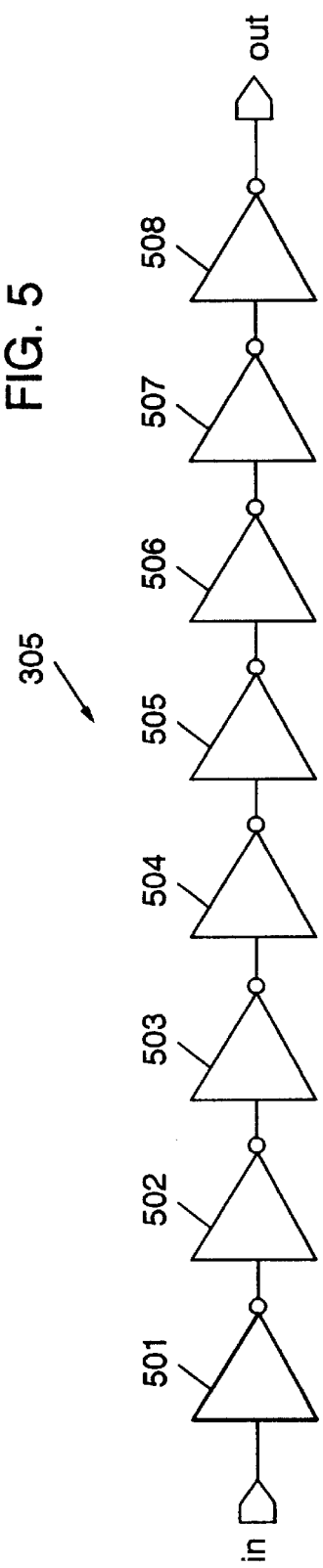
FIG. 5 illustrates further detail of an exemplary skewed delay mimic chain as illustrated in FIG. 3.

FIG. 5 is a sample skewed delay mimic chain 305. This circuit 305 propagates the rising edge of the input signal (labelled "in") at a slower rate than the falling edge to the output (labelled "out"). The delay of the rising edge is controlled by the sizes of NMOS devices of inverters 501, 503, 505, and 507 and PMOS devices of inverters 502, 504, 506, and 508. Conversely, the delay of the falling edge is controlled by the sizes of PMOS devices of inverters 501, 503, 505, and 507 and NMOS devices of inverters 502, 504, 506, and 508. When used in circuit 300 of FIG. 3, the delay of the rising edge is set to be slightly longer than the delay through the Combinatorial Static Logic Block 302. (The Combinitorial Static Logic Block 302 is a group of static logic gates of any fashion used to compute the output information (dataγ) from the input information (dataχ).) The delay of the falling edge is set to be as fast as reasonably possible, but is not as critical as the rising edge delay.

Figure 3:
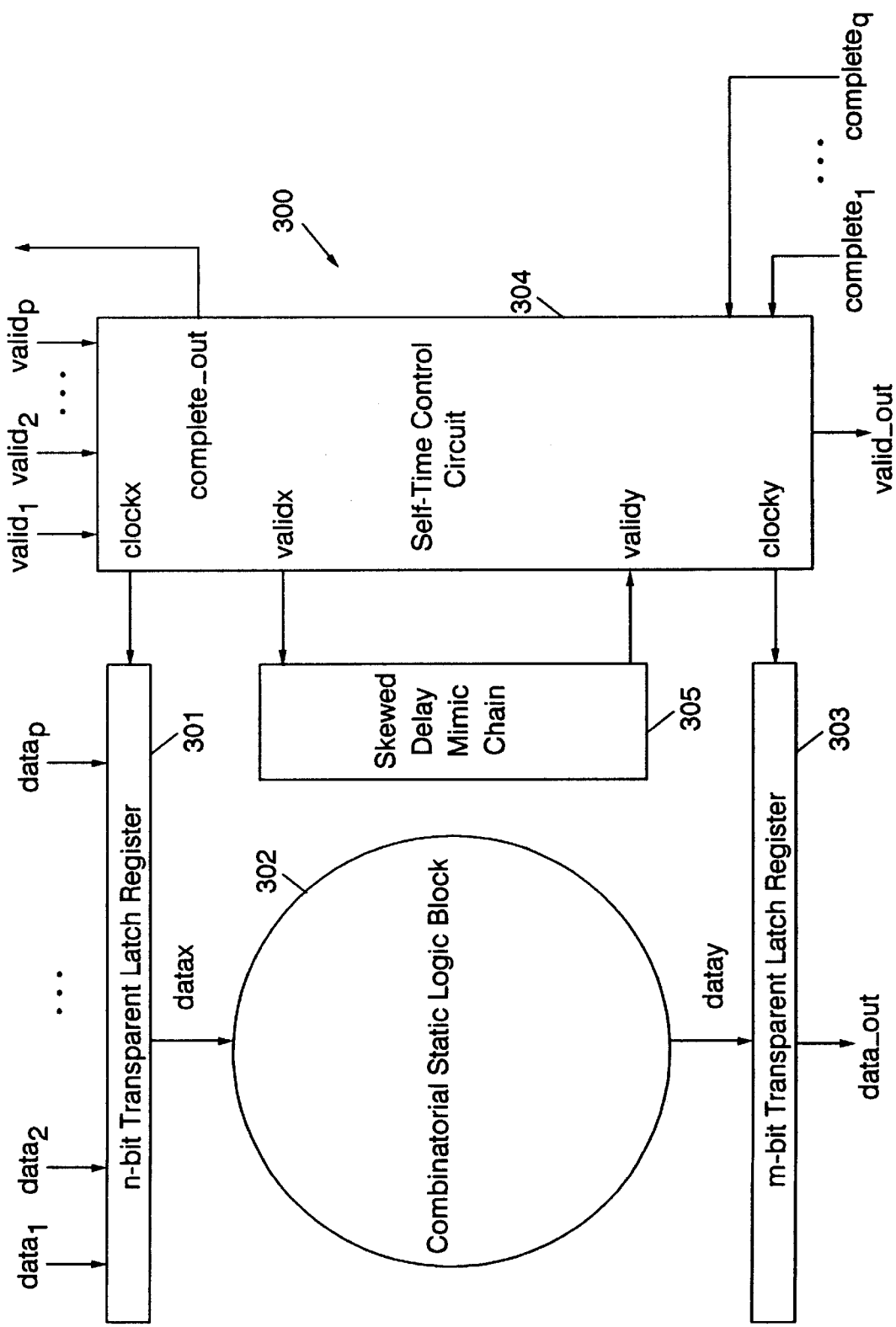
FIG. 3 illustrates a self-timed static logic circuit block in accordance with the present invention.
Figure 6:
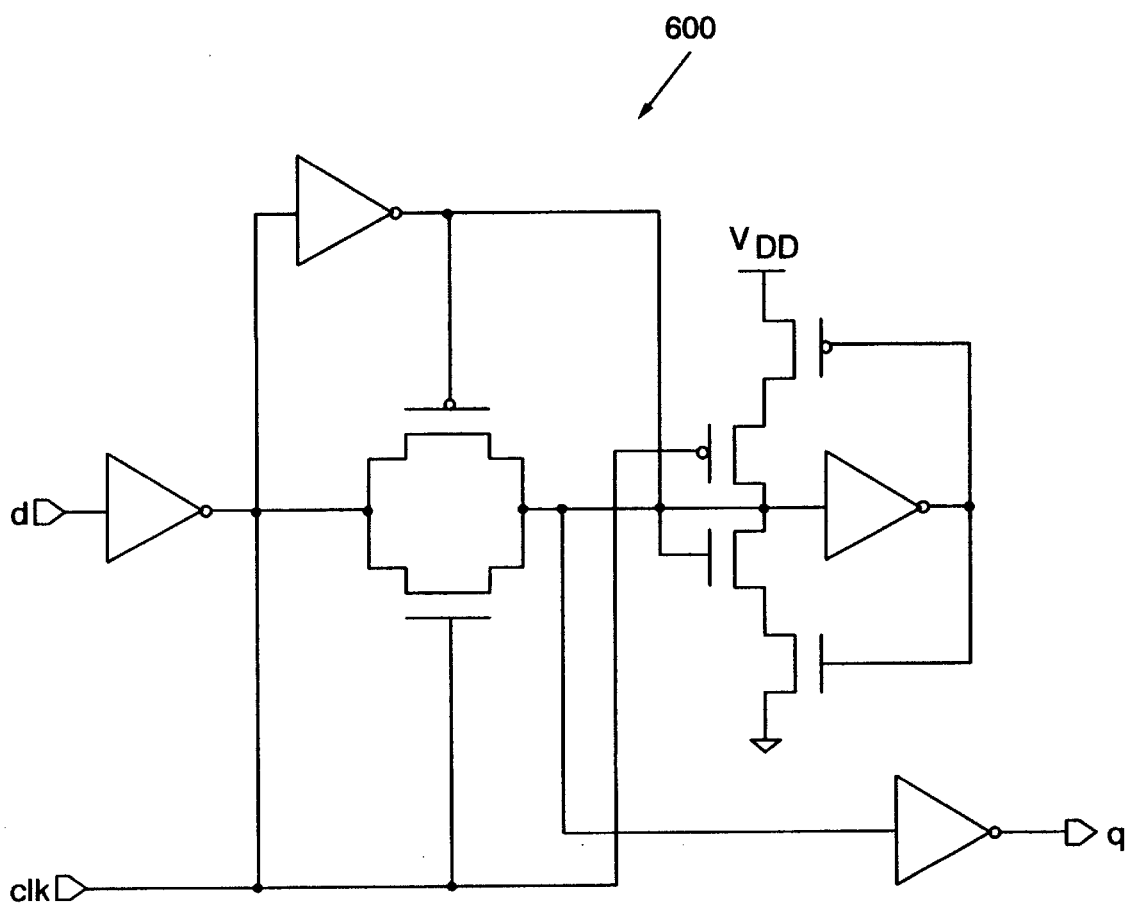
FIG. 6 illustrates further detail of a single bit of both the n-bit transparent latch register and the m-bit transparent latch register illustrated in FIG. 3.

FIG. 6 illustrates an example of a single bit latch 600 used to construct the Transparent Latch Register circuits 301, 303 of FIG. 3. These elements are connected with an identical "clk" line and separate data input and output sets. The circuit 600 operates in the following fashion:

When "clk" is high, the latch 600 is opened and the input "d" is fed to the output "q".

When "clk" goes low, the latch 600 stores the data that appeared on the input "q" when "clk" fell.

Figure 4:
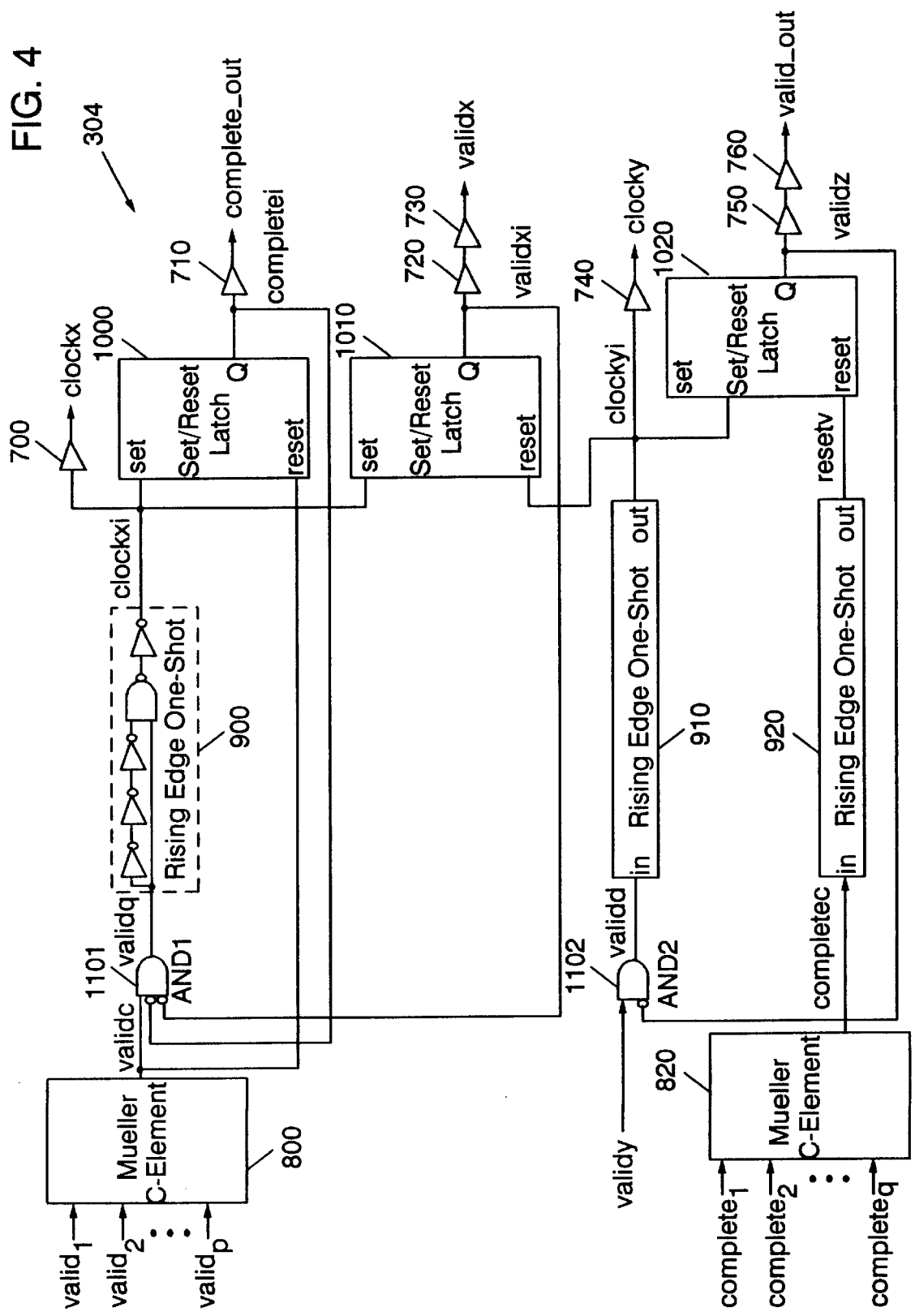
FIG. 4 illustrates further detail of the control circuit of FIG. 3.
Figure 7:
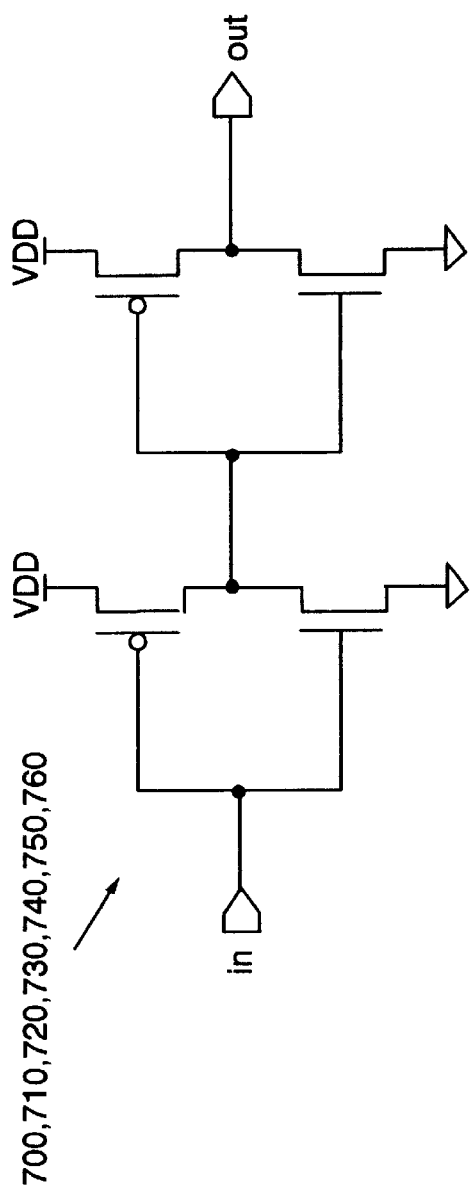
FIG. 7 illustrates a buffer circuit.

FIG. 7 illustrates a buffer circuit 700 used in the control circuit 304 of FIG. 4. It delays/buffers the input "in" to provide the output "out". Note that the buffer 700 is two inverters in series.

Figure 8:
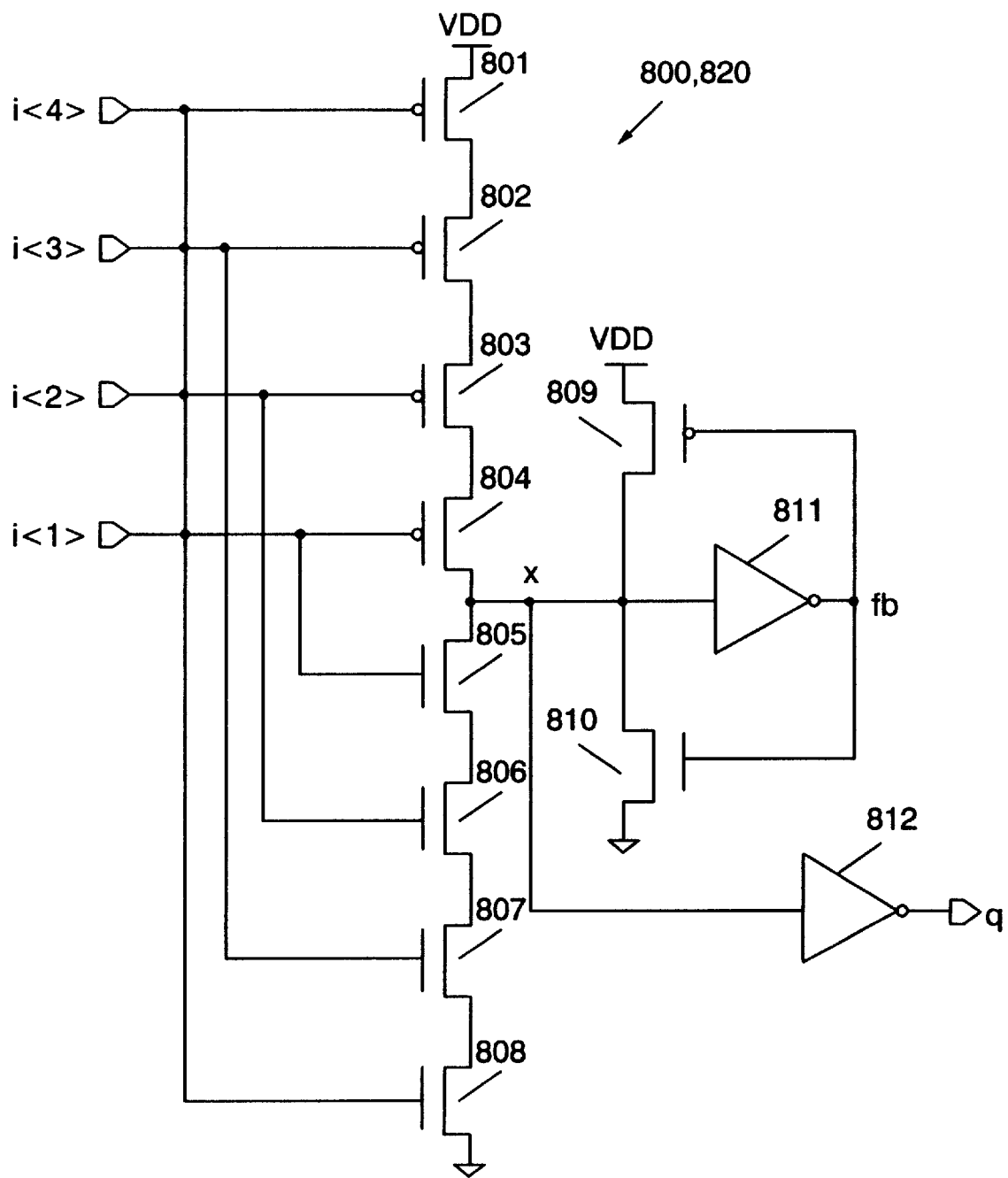
FIG. 8 illustrates a circuit diagram of a Mueller C-Element.

FIG. 8 is a 4-input Mueller C-Element 800 as used in control circuit 304 of FIG. 4. The 4-input component of the circuit 800 has been selected a sample embodiment of the inputs. The circuit 800 operates as follows:

When inputs i<1>, i<2>, i<3>, and i<4> all go high, node "x" is pulled low through NMOS devices 805–808 as the feedback device 809 is extremely weak and is easily overcome.

When node "x" is low, both the output "q" and node "fb" are forced high via their respective inverter connections 812, 811.

Node "x" remains low until such time that all inputs (i<1> through i<4>) go low, at which time node "x" is pulled up via PMOS devices 801–804 as the feedback device 810 is extremely weak and is easily overcome.

When node "x" is high, both the output "q" and node "fb" are forced low via their respective inverters 812, 811.

Note that a similar circuit for any number of inputs could easily be constructed using the same technique.

Figure 9:
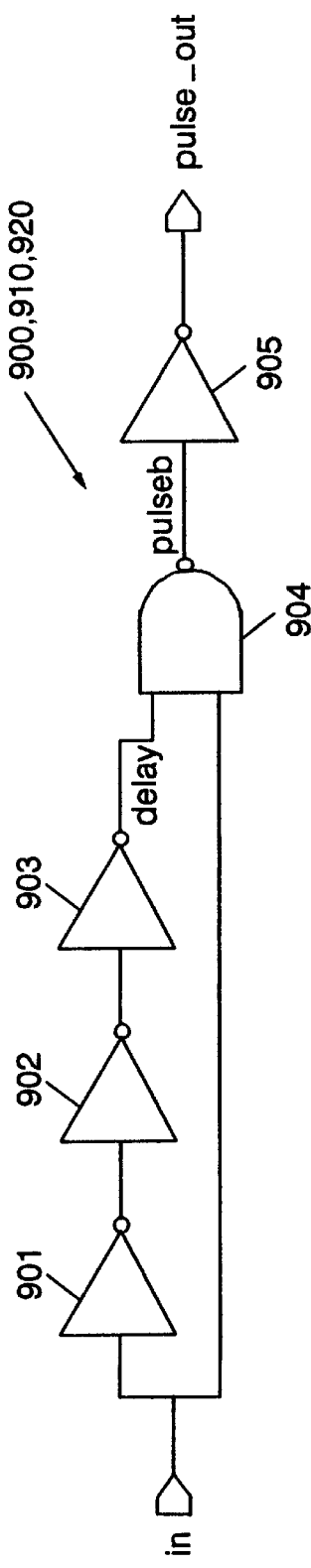
FIG. 9 illustrates a circuit diagram of a rising edge one-shot circuit.
Figure 2C:
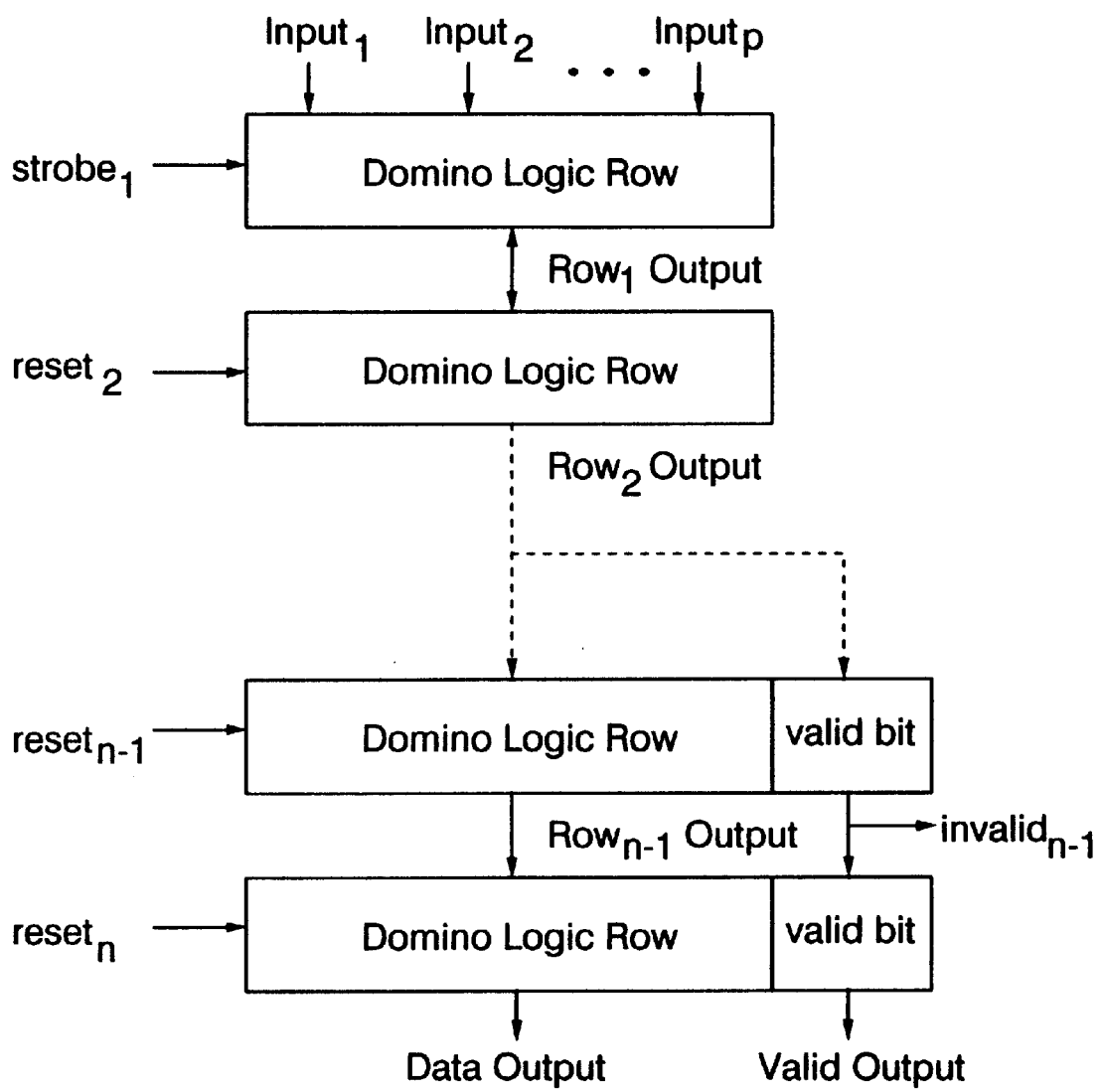

FIG. 9 illustrates a Rising Edge One-Shot circuit 900 used to create a pulse from an input signal as shown in FIG. 4. Circuit 900 produces an active high output pulse on the signal "pulse_out" when the input "in" rises. This occurs in the following manner:

When input "in" is low, node "delay" is high due to the odd number of inverters 901–903 between "in" and "delay". Node "pulseb", then, is high as input "in" is low via NAND gate 904. Thus, output "pulse_out" is low via inverter 905.

When input "in" goes high, NAND gate 904 sees two highs momentarily as both signals "in" and "delay" are high. This forces node "pulseb" low which, in turn, causes output "pulse_out" to go high. After an amount of time determined by the delays through inverters 901–903, node "delay" goes low. This, in turn, causes NAND gate 904 to force node "pulseb" back high, which then forces output "pulse_out" to return low. The combination, then, causes the output signal "pulse_out" to create an active-high output pulse in response to the rising edge of input "in".

After some amount of time, if input "in" goes low, note that no pulse is created. That is, if input "in" is high at a steady-state condition, then node "delay" is low, so node "pulseb" is high. When input "in" goes low, NAND gate 904 sees a low and a high value, when means node "pulseb" remains high. Then when node "delay" goes high in response to input "in", NAND gate 904 still sees a high and low value, so node "pulseb" remains high. Note that the inverter chain 901–903 is skewed (as in FIG. 5) to make the high delay to "pulseb" faster than the low.

Figure 10:
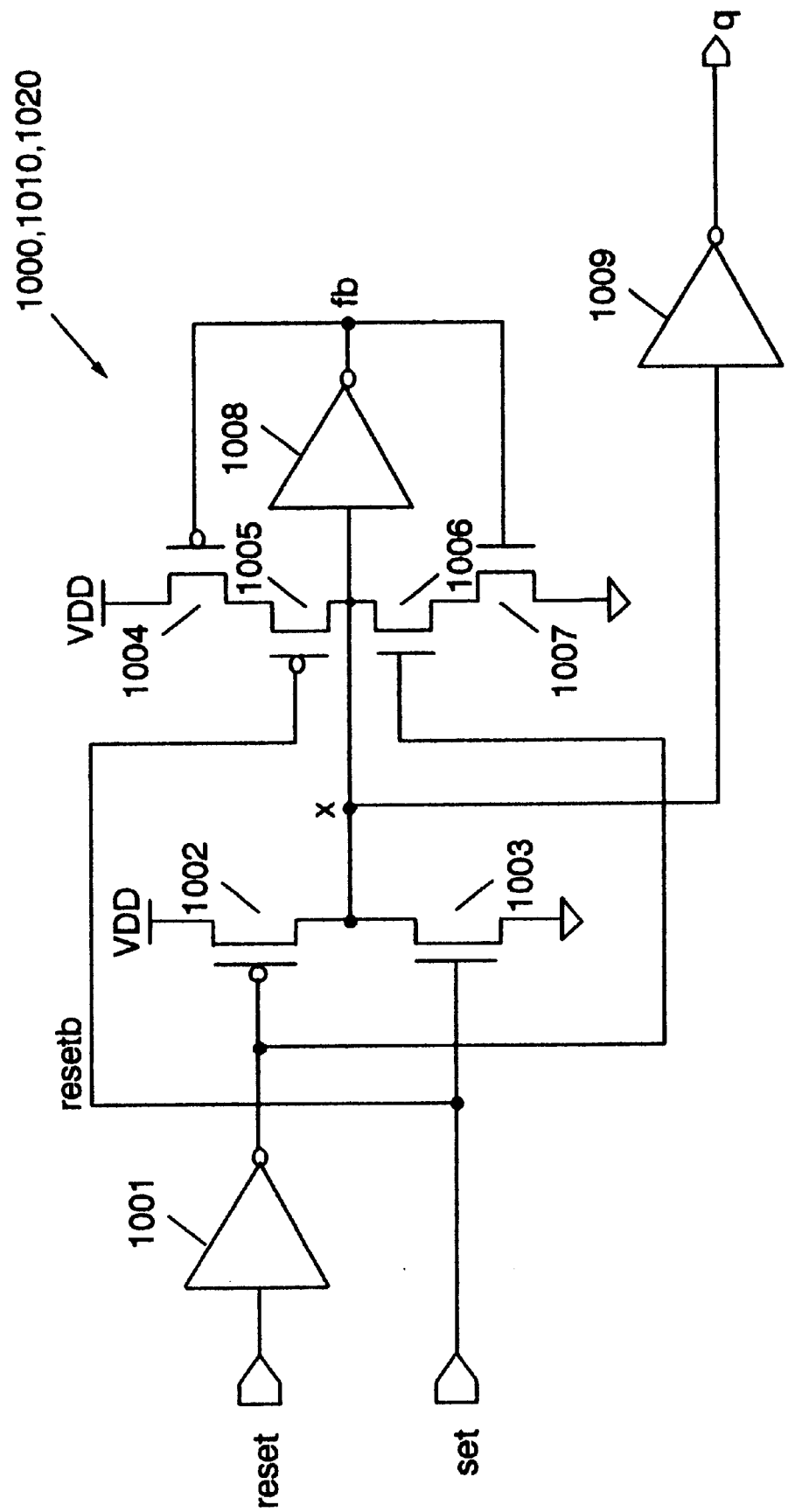
FIG. 10 illustrates a circuit diagram of a set/reset latch.

FIG. 10 illustrates a Set/Reset Latch circuit 1000 used to either set or reset the output node "q" of the circuit 1000. Circuit 1000 operates as follows:

When "set" pulses high and "reset" is low, NMOS device 1003 turns on and PMOS device 1005 turns off. This allows node "x" to be pulled low, which forces both output "q" and node "fb" to go high. Node "fb" high turns on NMOS device 1007. Note that NMOS device 1006 is already on since "reset" is low and "resetb", then, is high. When the "set" signal is removed, then, node "x" remains low, so both "q" and "fb" remain high.

When "reset" pulses high and "set" is low, then "resetb" pulses low.

Thus, PMOS device 1002 turns on (due to the low from inverter 1001) and NMOS device 1006 turns off. This allows node "x" to be pulled high, which forces both output "q" and node "fb" to go low, which turns on PMOS device 1004. Note that PMOS device 1005 is already on since "set" is low. When the "reset" signal is removed, then, node "x" remains high, so both "q" and "fb" remain low.

Note, it is a requirement of this sample circuit that "set" and "reset" never be active at any one time.

Figure 11A:
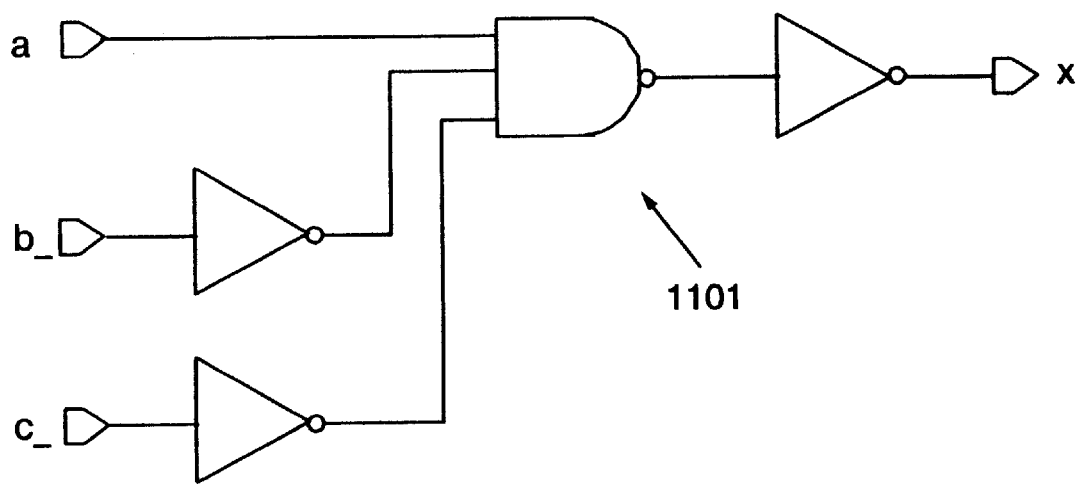
FIGS. 11A and 11B illustrate circuit diagrams of AND gates.
Figure 11B:
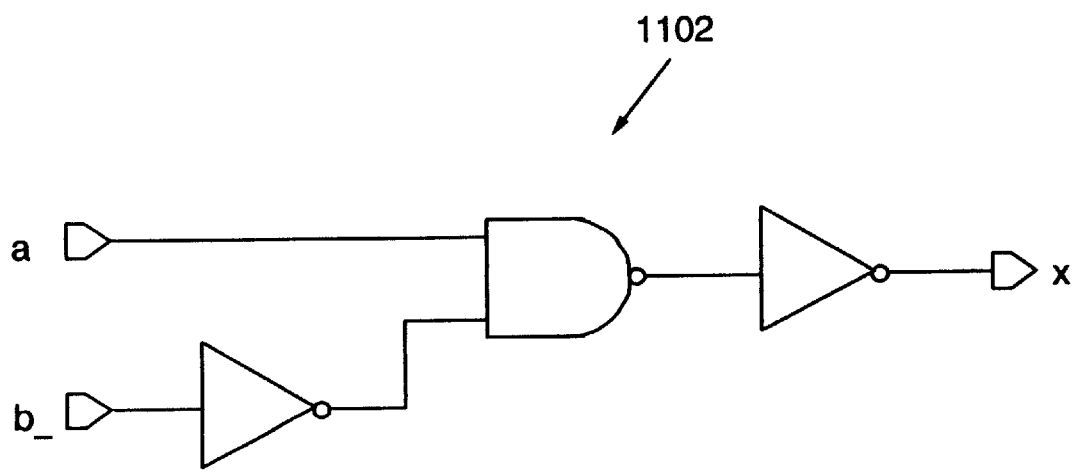

FIGS. 11A and 11B illustrate the two AND gates 1101, 1102 of FIG. 4. Circuit 1102 is a simple circuit whereby one input is inverted (signal "b_") and the other non-inverted ("a") and the two signals are ANDed. Note that "b_" corresponds to the "bubbled" input as used in FIG. 4. Likewise, circuit 1101 is a simple circuit whereby two inputs are inverted ("b_" and "c_") and the other non-inverted ("a") and the three signals are ANDed.

When the components are assembled to create the Self-Timed CMOS Static Logic Circuit 300, operation of the entire system permits logical functions to be performed without the existence of a pre-determined clock signal. This permits a fully self-timed system utilizing static logic 302 that follows the timing diagram of FIG. 12. Note, though, that in FIG. 12 three modes of operation have been no)ted: Data Input Gated, Previous Access Gated, and Sink Reception Gated. Each of these modes exists to solve particular intricacies of the self-timed logic construct in the whole of the circuitry of FIG. 3 and deserve specific detail on their operation. Note that in each of the descriptions that "Access Request" means that the source self-timed circuits are requesting the particular self-timed circuit to read their data and valid information and provide a complete return signal.

Access Request #1: Data Input Gated Operation

In this mode, the operation of the self-timed static circuit 300 begins after an idle state has been achieved and the input source(s) activate their valid signals. Consider, for example, the "Access Request #1" cycle of the timing diagram of FIG. 12. The idleness of self-timed static logic circuit 300 (FIG. 3) can be noted, for example, by the inactivity of the "valid_out" signal at the left of the diagram, which means that the output has not been activated for use by another self-timed circuit in recent history.

Operation occurs when the p source logic circuits (e.g., circuit 101 in FIG. 1 if the timing diagram refers to circuit 102) indicate that their respective data input busses (the data input buses are not shown due to space constraints; however, each bus is considered stable and valid when a corresponding valid signal is raised, e.g., "$valid_i$" high means bus signal set "$data_i$" is valid) are valid by raising their valid signals ("$valid_i$" through "$valid_p$"). Operation then occurs in the following sequence:

When "$valid_i$" through "$valid_p$" are all high, the Mueller C-Element 800 (FIG. 4) raises signal "validc".

Since "completei" and "validxi" are both low, "validc" causes "validq" to go high via circuit 1101.

"validq" going high means a rising edge is seen by the Rising Edge One-Shot 900, so "clockxi" pulses.

The "clockxi" pulse is buffered by buffer 700 to create "clockx" which then activates the n-bit Transparent Latch Register 301 loading the data (data$_1$ ... data$_p$) into the register 301, which causes "datax" to become valid.

"clockxi" also sets the two Set/Reset Latch circuits 1000, 1010 which causes "completei" and "validxi" to rise, respectively.

"completei" is buffered by buffer 710 to create "complete_out", which is routed back to the p source circuits to indicate that their data has been received by the logic circuit 300. The signals "valid$_1$" through "valid$_p$" then transition low according to all circuit dependencies. (Note that any self-timed source circuit can have a number of sink circuits; as such, the valid signal of a given circuit is not returned to the low state until all sink circuits have indicated their reception of the data by the raising of an associated complete signal.)

"completei" going high forces "validq" to fall via circuit 1101. This means that "validq" is no longer active. Note that this means that no future switching of "validc" can affect node "validq" until "validxi" is low again. Note, too, that the one-shot 900 produces no pulse as the edge on "validq" is falling, not rising.

"validxi" going high produces "validx" via buffers 720 and 730. The timing is such that "datax", loaded by "clockx" into the register 301, is valid before "validx" goes high (this is why "validxi" is buffered twice before producing "validx").

"datax" flows through the Combinatorial Static Logic Block 302 to produce the resulting data signal set "datay". Note that "datax" has a width of n bits while datay has a width of m bits.

The rising edge of "validx" feeds the Skewed Delay Mimic Chain 305 and produces a rising edge on "validy" at such a time to be later than the arrival of "datay".

"validy" rising causes "validd" to rise via AND gate 1102 since "validz" is low.

"validd" rising causes the Rising Edge One-Shot 910 to produce the pulse signal "clockyi".

Figure 12B:
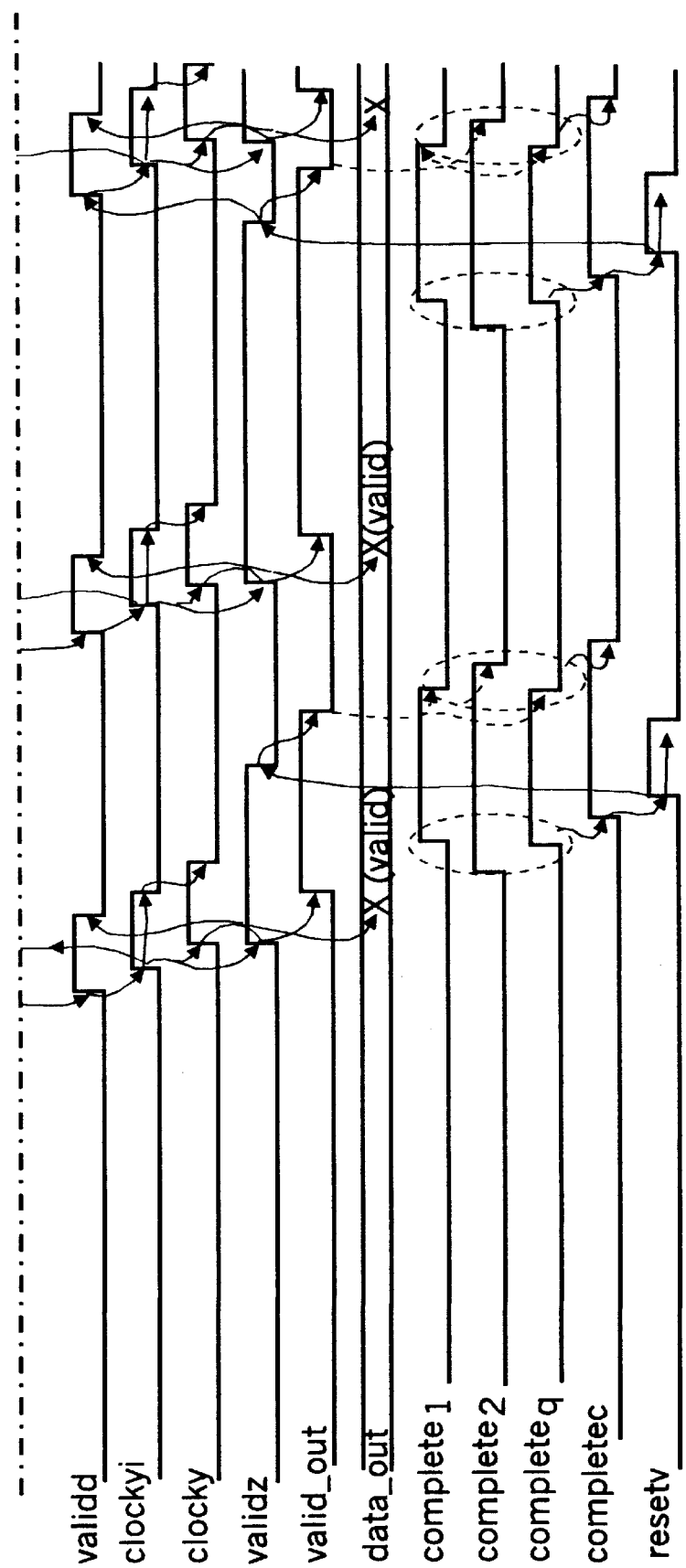

"clockyi" feeds the reset signal on the Set/Reset Latch 1010 for "validxi", forcing "validxi" to fall, which means that "validq" is released from the lock-out created by "validxi" being high. This signifies the completion of the use of the information stored in the n-bit Transparent Register 301. (The "validxi"signal, then, sets off another timing sequence as illustrated in FIG. 12 and discussed below with respect to the "Access#2: Previous Access Gated Operation".)

"clockyi" is also buffered by buffer 740 to produce "clocky" and, additionally, sets the Set/Reset Latch 1020, which causes "validz" to transition high.

"clocky" activates the m-bit Transparent Latch Register 303 loading the data into the register 303, which causes "data_out" to become valid.

"validz" high causes "validd" to fall via AND gate 1102. Note that this also locks out any future transition of "validy" from affecting "validd" until after "validz" has returned low. Note, too, that the one-shot 910 produces no pulse as the edge on "validd" is falling, not rising.

The rising edge of "validz" is also buffered twice by buffers 750, 760 to produce a rising edge on "valid_out". Note that the timing is such that "valid_out" rises after "data_out" is valid (this is why "validz" is buffered twice before producing "valid_out").

The net result of "data_out" becoming valid and "valid_out" rising means that the output data is available for use by the next self-timed circuit (e.g., circuit 104) of the entire self-timed system (see FIG. 1). Each receiving circuit acknowledges the receipt of the "data out" and "valid_out" signals by returning a "complete" signal, which is generated identically to the "complete_out" signal as described above.

When "complete$_1$" through "complete$_q$" are all high, the Mueller C-Element 820 produces a rising edge on "completec".

"completec" rising forces the Rising Edge One-Shot 920 to produce the pulse "resetv".

The "resetv" pulse feeds the Set/Reset Latch 1020 causing "validz" to fall.

"validz" falling forces "valid_out" to fall via the two buffers 750, 760.

Since "valid_out" feeds the receiving circuits, they, in turn, produce falling "complete" signals in response to the falling of "valid_out".

When all "complete" signals have fallen, then "completec" is permitted to fall. This signifies the completion of the transfer of the "data_out" information.

Access Request #2: Previous Access Gated Operation

In this mode, the operation of the self-timed static circuit 300 depends on the conpletion of the previous access operation. That is, the source circuits (e.g., circuit 101) are requesting the sink circuit (e.g., circuit 102) to receive (and operate upon) new information while the previous access operation has not yet been completed. That is, the valid input signals have been raised by the source circuits, but the sink circuit has not yet completed operating on the previous information stored in the n-bit Transparent Latch Register 301. This means that the storing of the new data information as well as returning the "complete_out" signal must wait on the completion of the previous access. Consider, for example, the "Access Request #2" cycle of the timing diagram of FIG. 12. Note that the self-timed static circuit 300 now is no longer idle in the previous cycle.

The operation here starts when the p source logic circuits indicate that their respective data input busses are valid by raising their valid signals ("valid$_1$" through. "valid$_p$"). However, note that when this occurs, "validxi" is now high, which means that "validq" cannot be affected.

When "valid$_1$" through "valid$_p$" are all high, the Mueller C-Element 800 raises signal "validc".

Because "validxi" is high, "validc" cannot force "validq" to rise via circuit 1101. Note that "validxi" high means that the operation on the data in the n-bit Transparent Latch Register 301 has not yet been completed.

When the previous operation on the data in the n-bit Transparent Latch Register 301 has been completed, the timing sequence described in the "Access Request #1: Data Input Gated Operation" pulses signal "clockyi".

"clockyi" pulsing (of the previous access) feeds the reset port of the Set/Reset Latch 1010, causing "validxi" to fall.

"validxi" falling causes the signal "validx" to fall via the two buffers 720, 730, which causes "validy" to quickly fall via the Skewed Delay Mimic Chain 305. The delay of this signal is designed to occur as fast as reasonably possible in order to prevent holding up the operation of the self-timed system unnecessarily.

"validxi" falling also releases circuit 1101 to operate on the "validc" signal (note that "completei" is already low in this case, since this is required since the source circuits must have forced their valid signals low in order to request a new operation) which, in turn, causes "validq" to rise.

The operation of the circuitry then continues as described in the "Access Requesit #1: Data Input Gated Operation" sequence as described previously and the signals "data_out" and "valid_out" are activated for use by the sink circuits.

However, note that in this case the sink circuits do not immediately return the complete signals, or the acknowledgment signals, to signify the "data_out" and "valid_out" signals have been received. This is caused by the sink circuits either receiving the data late due to locality (distance) or, most likely, resolving other valid dependencies from several source circuits. That is, since each circuit receives; data and valid signals from potentially several other circuit sources, there may exist data dependencies from those sources that force a delay in the complete signal generation via the Mueller C-Element 820 connected in the complete control circuitry (see FIG. 4).

When the reception of the "data_out" and "valid_out" is acknowledged, then the operation of the control circuitry 304 follows that described in "Access #1: Data Input Gated Operation" except for the interaction with the "validxi" signal as described in "Access #4: Sink Reception Gated Operation" described below.

Access Request #3: Data Input Gated Operation

This operation mode is essentially identical to that of "Access Request #1: Data Input Gated Operation" except for the reception of the information into the m-bit Transparent Latch Register 303 to generate the "data_out" signal validation. That is, the data input and valid signals are operated upon exactly as before and the information is stored in the n-bit Transparent Latch Register 301, validating the signals "datax" and "validx". This causes the Combinatorial Static Logic Block 302 and Skewed Delay Mimic Chain 305 to process the information and produce! the new values for "datay" and "validy". However, because the data in the m-bit Transparent Latch Register 303 has not yet been used, the "validd" signal remains low because "validz" is low feeding circuit 1102. This will remain this way until the "completec" signal activates the "resetv" signal to reset "validz". This operation is further described below in "Access #4: Sink Reception Gated Operation".

Access Request #4: Sink Reception Gated Operation

As described above (and by the designated name), this operation mode depends on the "data_out" and "valid_out" signals being received by the sink self-time d circuit(s). This means, again, that the sink circuits have dependencies or localities that have prevented one or more of them from returning a respective complete signal to the source self-timed circuit. As such, any new data that has been stored in the n-bit Transparent Latch Register 301 to produce "datax" and acted upon by the logic circuitry 302 to produce "datay" still has not been loaded into the n-bit Transparent Latch Register 301 for use by the sink circuits. Thus, it is necessary to prevent any new data from entering the n-bit Transparent Latch Register 301 until such time that the previous "datay" signal information has been stored in the m-bit Transparent Latch Register 303. If this is not done, then, an entire access request information set will be lost.

Consequently, an operational sequence must occur to prevent the data loss from occurring. This is performed by the lock-out functions provided by the control circuitry 304 of FIG. 4 in the following manner:

Because the data stored in the m-bit Transparent Latch Register 303 has not been used yet, signal "validxi" remains high.

Again, when the source circuits assert "valid$_i$" through "valid$_p$" all high, the Mueller C-Element 800 raises signal "valid". "valid", however, is locked out from affecting "validq" because "validxi" is high.

When the sink circuits all raise "complete$_i$" through "complete$_q$", signal "completec" rises via the Mueller C-Element 820.

"completec" rising causes the pulse signal "resetv" to be created via the Rising Edge One-Shot 920.

The "resetv" pulse feeds the reset port of the Set/Reset Latch 1020 which causes "validz" to go low. "validz" low allows circuit 1102 to pass the new "validy" signal to "validd", which then rises.

"validd" rising causes the Rising Edge One-Shot 910 to create the "clockyi" pulse.

"clockyi" feeds the reset port of a Set/Reset Latch 1010 for signal "validxi" which, then, switches "validxi" low.

"validxi", in turn, allows circuit 1101 to pass the new access request signal from the Mueller C-Element 800 on "validc" to "validq". This, then, allows new data to be stored in the n-bit Transparent Latch Register 301, meaning that the new access request information is stored following the sequence described in "Access #1: Data Input Gated Operation".

In parallel to the last step (which allowed the new access information to be stored), "clockyi" is buffered by buffer 740 to create signal "clocky" and, also, sets the "validz" signal.

"locky", as before, stores the information on "datay" in the m-bit Transparent Latch Register 303 to create "data_out". In parallel, "validz", also as before, is buffered by buffers 750, 760 to create "valid_out". This means that the output information is now available for use by the sink self-timed circuits. Operation now occurs as before, whether following this case described here for the next access or a previous case.

The summary of this operation mode is that the self-timed circuit timing is held up so that "data_out" signals are set, actually, to the last data possible, thus preventing the loss of the information from the previous access operation. That is, this self-timed circuit stalls itself until such time that the sink self-timed circuits have indicated that the information from the previous access—stored in the m-bit Transparent Latch Register 303—has been properly received by indication via the complete signals.

The summary of the operation of the self-timed static circuit construct described in FIGS. 3 through 11 and the timing diagram of FIG. 12 is that each such circuit provides the following features:

New access information is stored in the "n-bit Transparent Latch Register" for use by the self-timed static circuit. This allows the data to be used for logical functions for the circuit and the source circuits to process new information.

A complete signal is routed to the source macros when the input data has been received. This insures that all dependencies have been resolved, such as would occur in the construct of FIG. 1.

Any incoming operation request is not processed until the data stored in the "n-bit Transparent Latch Register" is guaranteed to have been processed by the "Combinatorial Static Logic Block". This is accomplished via the circuit "AND1" in conjunction with the signals "validc", "validxi", and "completei".

Any new processed information is retained on the data outputs using the "m-bit Transparent Latch Register" until it has been received by the sink self-timed circuits. This is done via the "AND2" circuit in conjunction with the "validy" and "validz" signals. Note that this also prevents any unprocessed information from being lost in the "n-bit Transparent Latch Register" by virtue of the connection between from "clockyi" to the "Set/Reset Latch" controlling "validxi". That is, a full handshake operation is provided with the sink self-timed circuits via the use of the complete signals in conjunction with the "Mueller C-Element". This means that the sink macros must designate reception of the information before any new information can be sent.

Additionally, the circuitry described here will also function in any self-timed system using dynamic circuits of the type described in U.S. Pat. Nos. 5,565,798 and 5,708,375. That is, this static self-timed system can be a plug-in replacement for most any dynamic self-timed circuit as described therein.

Although the present invention and its advantages have been described in detail, it should be understood that Various changes, substitutions and alterations can be made herein without departing from the spirit and scope of the invention as defined by the appended claims.

What is claimed is:

1. A self-timed logic circuit comprising:
   a first transparent latch register operable for receiving one or more input data signals from one or more sources;
   a control circuit operable for receiving one or more valid signals, wherein each one of the one or more valid signals is associated with a particular input data signal;
   a combinatorial static logic block comprising one or more static logic circuits, wherein the control circuit; clocks the one or more input data signals from the first transparent latch register to the combinatorial static logic block when all of the one or more valid signals are received by the control circuit, wherein the combinatorial static logic block produces one or more output data signals; and
   a second transparent latch register operable for receiving the one or more output data signals.

2. The circuit as recited in claim 1, wherein the control circuit clocks the one or more output data signals through the second transparent latch register after the combinatorial static logic block has produced the one or more output data signals.

3. The circuit as recited in claim 2, wherein the control circuit sends one or more output valid signals in association with the one or more output data signals, wherein the one or more output data signals and the one or more output valid signals are sent to one or more sink circuits.

4. The circuit as recited in claim 2, wherein the combinatorial static logic block produces the one or more output data signals after a designated period of time.

5. The circuit as recited in claim 1, wherein the control circuit is operable for sending one or more complete signals to the one or more source circuits in response to receipt of all of the one or more valid signals.

6. A self-timed logic circuit comprising:
   a first transparent latch register operable for receiving one or more input data signals from one or more sources;
   a control circuit operable for receiving one or more valid signals wherein each one of the one or more valid signals is associated with a particular input data signal;
   a combinatorial static logic block comprising one or more static logic circuits, wherein the control circuit clocks the one or more input data signals from the first transparent latch register to the combinatorial static logic block when all of the one or more valid signals are received by the control circuit, wherein the combinatorial static logic block produces one or more output data signalsl;
   a second transparent latch register operable for receiving the one or more output data signals,
   wherein the control circuit clocks the one or more output data signals through the second transparent latch register after the combinatorial static logic block has produced the one or more output data signals,
   wherein the control circuit sends one or more output valid signals in association with the one or more output data signals, wherein the one or more output data signals and the one or more output valid signals are sent to one or more sink circuits; and
   circuitry in the control circuit for maintaining the one or more output data signals until all of one or more complete signals, associated with the one or more output data signals, are received from the one or more sink circuits.

7. A self-timed logic circuit comprising:
   a first transparent latch register operable for receiving one or more input data signals, from one or more sources;
   a control circuit operable for receiving one or more valid signals, wherein each one of the one or more valid signals is associated with a particular input data signal;
   a combinatorial static logic block comprising one or more static logic circuits, wherein the control circuit clocks the one or more input data signals from the first transparent latch register to the combinatorial static logic block when all of the one or more valid signals are received by the control circuit, wherein the combinatorial static logic block produces one or more output data signals;
   a second transparent latch register operable for receiving the one or more output data signals,
   wherein the control circuit clocks the one or more output data signals through the second transparent latch register after the combinatorial static logic block has produced the one or more output data signals,
   wherein the combinatorial static logic block produces the one or more output data signals after a designated period of time; and
   a delay circuit operable for producing a delayed signal in response to the one or more valid signals, wherein the clocking of the one or more output data signals through the second transparent latch register is performed in response to the delayed signal.

8. The circuit as recited in claim 7, wherein timing of the delay circuit roughly corresponds to an amount of time it takes for the combinatorial static logic block to produce the one or more output data signals from the one or more input data signals.

9. The circuit as recited in claim 8, wherein the delay circuit produces the delayed signal after the one or more output data signals are outputted to the second transparent latch register.

10. The circuit as recited in claim 7, wherein the control circuit further comprises:
    a Mueller C-Element operable for receiving the one or more valid signals;
    a first AND gate having an input coupled to an output of the Mueller C-Element;

a first rising edge one-shot having an input coupled to an output of the first AND gate, wherein an output of the first rising edge one-shot is coupled to a clock input of the first transparent latch register;

a set/reset latch having a set input coupled to the output of the first rising edge one-shot, wherein an output of the set/reset latch is coupled to an input of the delay circuit;

a second AND gate having an input coupled to an output of the delay circuit; and a second rising edge one-shot having an input coupled to an output of the second AND gate, wherein an output of the second rising edge one-shot is coupled to a clock input of the second transparent latch register.

11. The circuit as recited in claim 6, wherein the delay circuit propagates a rising edge of its input signal at a slower rate than a falling edge to its output.

* * * * *

UNITED STATES PATENT AND TRADEMARK OFFICE
CERTIFICATE OF CORRECTION

PATENT NO. : 6,522,170 B1
DATED : February 18, 2003
INVENTOR(S) : Christopher McCall Durham and Peter Juergen Klim It is certified that error appears in the above-identified patent and that said Letters Patent is hereby corrected as shown below:

Column 10,
Line 31, please replace "locky" with -- clocky --.

Column 11,
Line 34, following "circuit" please delete -- ; --.

Column 12,
Line 6, please replace "signalsl" with -- signals --.
Line 25, following "signals" please delete -- , --.

Column 14,
Line 5, please replace "6" with -- 7 --.

Signed and Sealed this

Sixth Day of January, 2004

JAMES E. ROGAN
*Director of the United States Patent and Trademark Office*